United States Patent
Oshino

(12) 
(10) Patent No.: US 6,208,707 B1
(45) Date of Patent: Mar. 27, 2001

(54) X-RAY PROJECTION EXPOSURE APPARATUS

(75) Inventor: Tetsuya Oshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/262,096

(22) Filed: Mar. 4, 1999

(30) Foreign Application Priority Data

Mar. 5, 1998 (JP) .................................................. 10-053434

(51) Int. Cl.⁷ ......................................................... B05D 3/06

(52) U.S. Cl. ................................................ 378/34; 378/84

(58) Field of Search .................................. 378/34, 84, 85, 378/205, 206

(56) References Cited

U.S. PATENT DOCUMENTS 5,641,593 * 6/1997 Watanabe et al. ...................... 378/34
5,848,199 * 12/1998 Miyake et al. .......................... 378/43

* cited by examiner

Primary Examiner—David P. Porta
Assistant Examiner—Irakli Kiknadze
(74) Attorney, Agent, or Firm—Morgan, Lewis & Bockius LLP

(57) ABSTRACT

An X-ray projection exposure apparatus includes a mask stage configured to hold a mask having a predetermined pattern thereon, a substrate stage configured to hold a substrate, and an X-ray source that emits exposing X-rays and detection light having a wavelength different from the exposing X-rays for use in detecting a position of at least one of the mask and the substrate. The apparatus further includes an X-ray illumination optical system configured to direct the exposing X-rays and the detection light towards the mask, an X-ray projection and focusing optical system for receiving the exposing X-rays that have interacted with the mask, and projecting and focusing an image of the predetermined pattern on the mask onto the substrate, and a detector for detecting the detection light that has interacted with the mask to derive the position of the at least one of the mask and the substrate.

19 Claims, 5 Drawing Sheets

X-RAY PROJECTION EXPOSURE APPARATUS

This application claims the benefit of Japanese Application No. 10-053434, filed in Japan on Mar. 5, 1998, which is hereby incorporated by reference.

BACKGROUND OF THE INVENTION

1. Field of the Invention

The present invention relates to an X-ray projection exposure apparatus which is suitable for use in transferring circuit patterns on a mask (also called "reticle") onto a substrate, such as a wafer, etc., and more particularly, to an X-ray projection exposure apparatus having a reflective type focusing optical system of a mirror projection system, such as an X-ray optical system, etc.

2. Discussion of the Related Art

Conventionally, in a exposure apparatus used for semiconductor manufacture, circuit patterns formed on a mask (photo-mask) are projected and transferred onto a photosensitive substrate, such as a wafer, etc., via a focusing optical system. The photosensitive substrate is coated with a resist, and the resist is exposed to form a resist pattern.

The resolving power W of the exposure apparatus is determined mainly by the wavelength $\lambda$ of the exposing light and the numerical aperture NA of the focusing optical system, and is expressed by the following equation:

$$W = k\lambda/NA \quad (k: \text{constant}) \qquad (1)$$

Accordingly, in order to improve the resolving power, it is necessary to either shorten the wavelength or increase the numerical aperture. Currently, exposure apparatus used in the manufacture of semiconductor devices normally employs the i-line having a wavelength of 365 nm, so that a resolving power of 0.5 $\mu$m is obtained at a numerical aperture of approximately 0.5. Since increasing of the numerical aperture is difficult from the standpoint of optical design, it will be necessary in the future to shorten the wavelength of the exposing light. An example of exposing light having a wavelength shorter than the i-line is excimer laser light. The wavelengths are 248 nm for KrF and 193 nm for ArF, respectively. A resolving power of 0.25 $\mu$m can be achieved in the case of KrF, and a resolving power of 0.18 $\mu$m can be achieved in the case of ArF. Furthermore, if X-rays having an even shorter wavelength are available as exposing light, a resolving power of 0.1 $\mu$m or less should be achieved at a wavelength of 13 nm, for example.

A conventional exposure apparatus is constructed mainly of a light source, an illumination optical system, and a projection and focusing optical system. The projection and focusing optical system is constructed from a plurality of lenses or reflective mirrors, etc., and is arranged so that the pattern on the mask if focused on the wafer.

To obtain the desired resolving power, it is necessary that at least the focusing optical system be essentially free from any aberrations. If any aberrations are present in the focusing optical system, the desired cross-sectional shape in the resist pattern cannot be obtained, and accordingly, adverse effects, such as image distortion problem, may arise in the processes due to such inadequate exposure.

Furthermore, in the conventional semiconductor exposure apparatus, a position detection device (also referred to as an "alignment device") is provided so that a resist pattern can be formed in a pre-determined position on the wafer with respect to existing circuit patterns on the wafer. The positions of the mask and the wafer are detected by the alignment device, and the respective positions of the wafer and the mask are adjusted by a wafer stage and a mask stage so that a reduced image of the mask pattern is focused at a prescribed position on the surface of the wafer.

The alignment device may be an optical detection device. The optical detection device illuminates alignment marks on the wafer with illuminating light and detects the reflected light or the like by a photo-detector, for example. When the wafer position changes, the signal output from the detector also changes, so that the wafer position can be measured. Similarly, in the case of the mask, the position of the mask can be detected by illuminating alignment marks on the mask with illuminating light, and then detecting the reflected light or the like by a photo-detector.

Such an alignment device can detect the positions of the alignment marks on the wafer and the mask with a high degree of precision. Accordingly, alignment of the mask and wafer can accurately be performed. In the conventional exposure apparatus, the alignment device is disposed between the focusing optical system and the wafer and/or between the focusing optical system and the mask.

FIG. 4 schematically shows main elements of a conventional exposure apparatus using the i-line. The conventional exposure apparatus includes a light source, an illumination optical system (not shown in the figures), a stage 15 for holding mask 14, a projection and focusing optical system 13, a stage 17 for holding wafer 16, and alignment devices 18. A mask pattern, which is equal in size to the pattern that is to be drawn on the wafer, or which is to be reduced upon exposure, is formed on the mask 14. The projection and focusing optical system 13 is constructed of a plurality of lenses, etc., and is arranged to focus the image of the pattern on the mask 14 onto the wafer 16. The focusing optical system has a field of view of about 20 mm in diameter so that the entire mask pattern can be transferred to the surface of the wafer 16 in a single transfer. The positions of alignment marks on the mask and the wafer are detected by the alignment devices 18 (position detection device).

As described above, in the conventional exposure apparatus using the i-line or the like, the projection and focusing optical system can be constructed of lenses. Accordingly, an optical system having a field of view of 20 mm square or even greater can be designed. Thus, a desired region (e.g., an area corresponding to two (2) semiconductor chips) can be exposed at one time.

On the other hand, in the design of a focusing optical system for X-rays, the field of view needs to be reduced, and therefore, the desired large region cannot be exposed at one time. To cope with this problem, a proposed design of the X-ray exposure apparatus utilizes a scanning scheme in which a semiconductor chip with an area of 20 mm square or greater is exposed using a focusing optical system with a small field of view by synchronously scanning the mask and the wafer during exposure. By using such a method, it is possible to expose the desired large exposure region by an X-ray projection exposure apparatus.

For example, in the case of exposure by X-rays with a wavelength of 13 nm, it is possible to form the exposure field of view of the projection and focusing optical system as an annular band like shape, so that a high resolving power can be obtained.

FIG. 5 schematically shows a proposed design of an X-ray projection exposure apparatus. The apparatus includes an X-ray source 1, an X-ray illumination optical system 2, a stage 5 for holding mask 4, an X-ray projection and focusing optical system 3, and a stage 7 for holding wafer 6. A pattern which is equal in size to the pattern that is to be drawn on the wafer, or which is to be reduced upon exposure, is formed on the mask 4. The projection and focusing optical system 3 includes a plurality of reflective mirrors, etc., and is designed to focus the image of the pattern on the mask 4 onto the wafer 6. The focusing optical system 3 has an annular band like field of view, and a portion of the mask pattern in an annular band like region is transferred onto the wafer 6. During exposure, the mask 4 is illuminated with X-rays 11, and the reflected X-rays 12 are projected towards the wafer 6 through the X-ray projection and focusing optical system 3. Mask 4 and wafer 6 are synchronously scanned at respective constant speeds to expose a desired region (e.g., a region corresponding to one semiconductor chip).

In general, when an alignment device is installed in an X-ray projection exposure apparatus, a light source and an illumination system, which illuminate alignment marks on the mask and/or the wafer are required. The installation of such a light source and illumination system in the exposure apparatus involves difficulties in terms of layout, and also increases costs. This is particularly a problem in the design of an X-ray projection exposure apparatus. In an X-ray projection exposure apparatus, some of the reflective mirrors constituting the focusing optical system are disposed in close proximity to the wafer due to various optical design constraints. Accordingly, it is difficult to install the optical system of the alignment device between the focusing optical system and the wafer.

In this connection, the following two points are noteworthy: (1) If the position of the reflective mirror closest to the wafer among the reflective mirrors constituting the focusing optical system is removed from the wafer in order to create a sufficient gap between the wafer and the reflective mirrors to install the optical system of the alignment device, the focusing performance of the focusing optical system suffers, and the desired fine pattern cannot be projected; and (2) If the reflective mirror closest to the wafer among the reflective mirrors constituting the focusing optical system is made thinner in order to increase the above-mentioned gap to install the optical system of the alignment device, the rigidity of the mirror drops, and it becomes difficult to manufacture such a mirror with high accuracy. In other words, these simple methods of increasing the gap between the wafer and the reflective mirrors to install the optical system of the alignment device would sacrifice the optical performance of the focusing optical system.

SUMMARY OF THE INVENTION

Accordingly, the present invention is directed to an X-ray projection exposure apparatus that substantially obviates the problems due to limitations and disadvantages of the related art.

An object of the present invention is to provide an X-ray projection exposure apparatus in which alignment detection can easily be accomplished.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides an X-ray projection exposure apparatus, including a mask stage configured to hold a mask having a predetermined pattern thereon; a substrate stage configured to hold a substrate; an X-ray source that emits exposing X-rays and detection light having a wavelength different from the exposing X-rays for use in detecting a position of at least one of the mask and the substrate; an X-ray illumination optical system configured to direct the exposing X-rays and the detection light towards the mask; an X-ray projection and focusing optical system receiving the exposing X-rays that have interacted with the mask, and projecting and focusing an image of the predetermined pattern on the mask onto the substrate; and a detector detecting the detection light that has interacted with the mask to derive the position of the at least one of the mask and the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

A first aspect of the present invention provides the X-ray projection exposure apparatus including an X-ray source, and an X-ray illumination optical system which directs X-rays generated by the X-ray source onto a mask having a prescribed pattern. An X-ray projection and focusing optical system receives X-rays from the mask and projects and focuses an image of the pattern on a substrate. A mask stage holds the mask. A substrate stage holds the substrate. A position detection optical system optically detects marks on the mask and/or substrate. The position detection optical system uses light which has a longer wavelength than the X-rays emitted by the X-ray source to detect the marks on the mask and/or substrate.

The position detection light may pass through the X-ray illumination optical system. The position detection light may pass through the X-ray projection and focusing optical system. The position detection mechanism may illuminate at least marks formed on the mask with the position detection light, reflect light reflected by the mask by means of reflective mirrors of the X-ray projection and focusing optical system, thus directing this light to the wafer, and detect marks formed on the wafer by means of the position detection optical system. The position detection mechanism may illuminate at least marks formed on the mask with the position detection light, reflect light reflected by the mask by means of reflective mirrors of the X-ray projection and focusing optical system, thus conducting this light to the substrate so that marks formed on the substrate are illuminated, and reflect light reflected by the substrate by means of reflective mirrors of the X-ray projection and focusing optical system so that this light is detected by the position detection optical system.

A filter, which restricts the transmitted wavelength, may be disposed in the X-ray illumination optical system, and a mechanism which varies the position of this filter may be provided. The X-ray source may be a laser plasma X-ray source. The X-ray source may be synchrotron radiation light. A movement mechanism may be disposed in the position detection optical system. The numerical aperture of the position detection optical system may be half the numerical aperture of the X-ray projection and focusing optical system or less. The position detection optical system may include a half-mirror. A temperature regulating mechanism may be disposed in the position detection optical system.

Reference will now be made in detail to the preferred embodiments of the present invention, examples of which are illustrated in the accompanying drawings.

Figure 1:
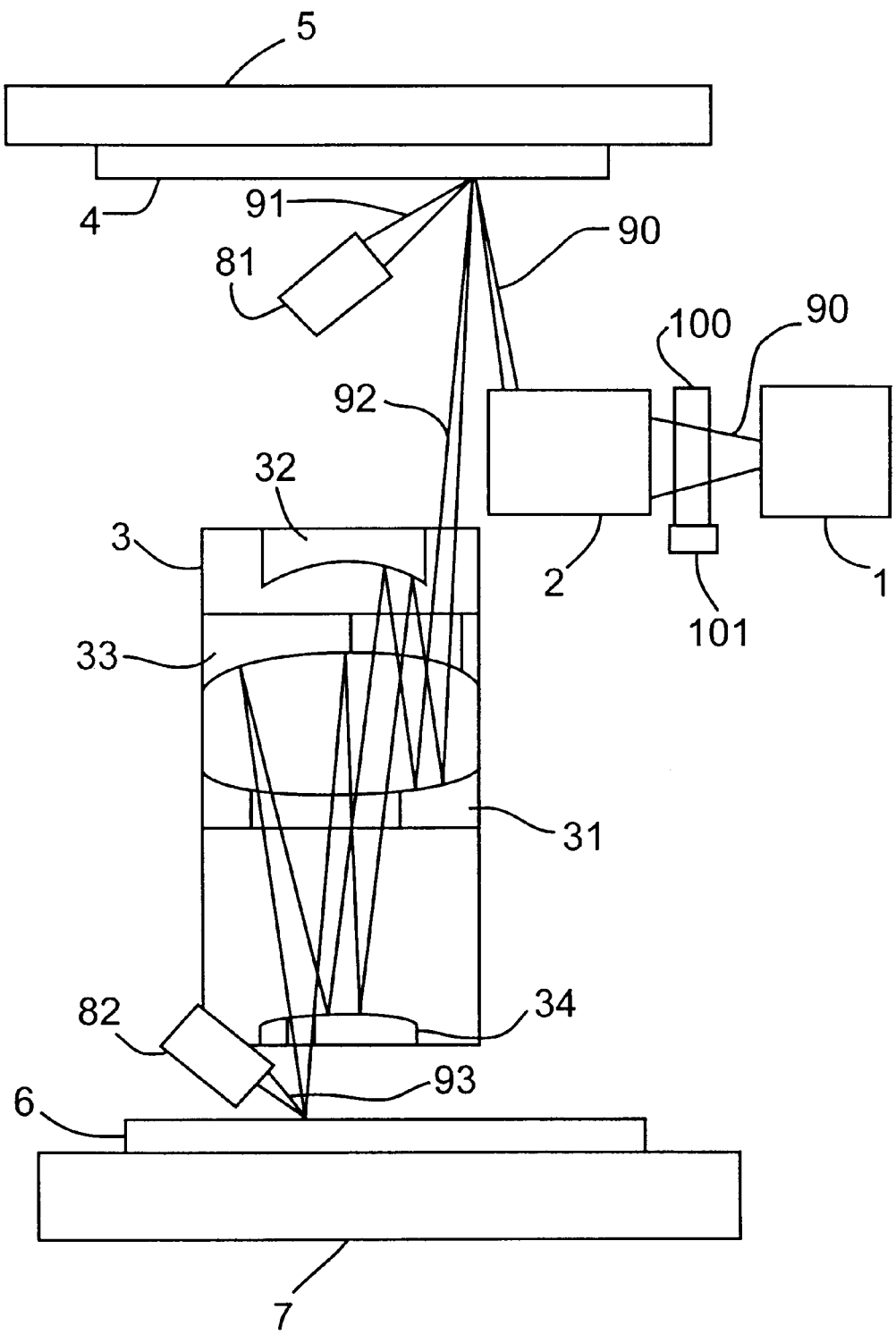
FIG. 1 is a schematic diagram of an X-ray projection exposure apparatus according to a preferred embodiment of the present invention.

A schematic diagram of an X-ray projection exposure apparatus according to a preferred embodiment of the present invention is shown in FIG. 1.

The apparatus includes an X-ray source 1, an X-ray illumination optical system 2, and an X-ray projection and focusing optical system 3. The apparatus further includes a mask stage 5 which holds a mask 4, a wafer stage 7 which holds a wafer 6, and an alignment detection device 81, 82. A pattern, which is equal in size to the pattern that is to be drawn of the wafer, or which is to be reduced, is formed on the mask 4. The X-ray projection and focusing optical system 3 includes a plurality of reflective mirrors, etc., and is arranged so that the pattern on the mask 4 is focused on the wafer 6. The X-ray projection and focusing optical system 3 has an annular band-form field of view so that a portion of the mask pattern on the mask 4 is transferred onto the wafer 6. The desired region is exposed by synchronously scanning the mask 4 and wafer 6 at respective constant speeds during exposure. The X-ray projection and focusing optical system 3 includes a plurality of reflective mirrors 31, 32, 33, and 34, which reflect X-rays. It is desirable that a multi-layer coating film be formed on the surfaces of the reflective mirrors in order to increase the X-ray reflectivity.

In the present preferred embodiment, a laser plasma X-ray source is used as the X-ray source as an example. The exposure wavelength is set at 13 nm, and a reflective type mask is used as the mask 4. The transfer ratio is set at 1/4. Since the transfer ratio is 1/4, the speed of the wafer stage is set at one-quarter of the speed of the mask stage for scan-exposure. In the figure, only the light used for alignment is shown, and the X-ray beam used as exposing light is omitted from the figure for simplicity.

Figure 5:
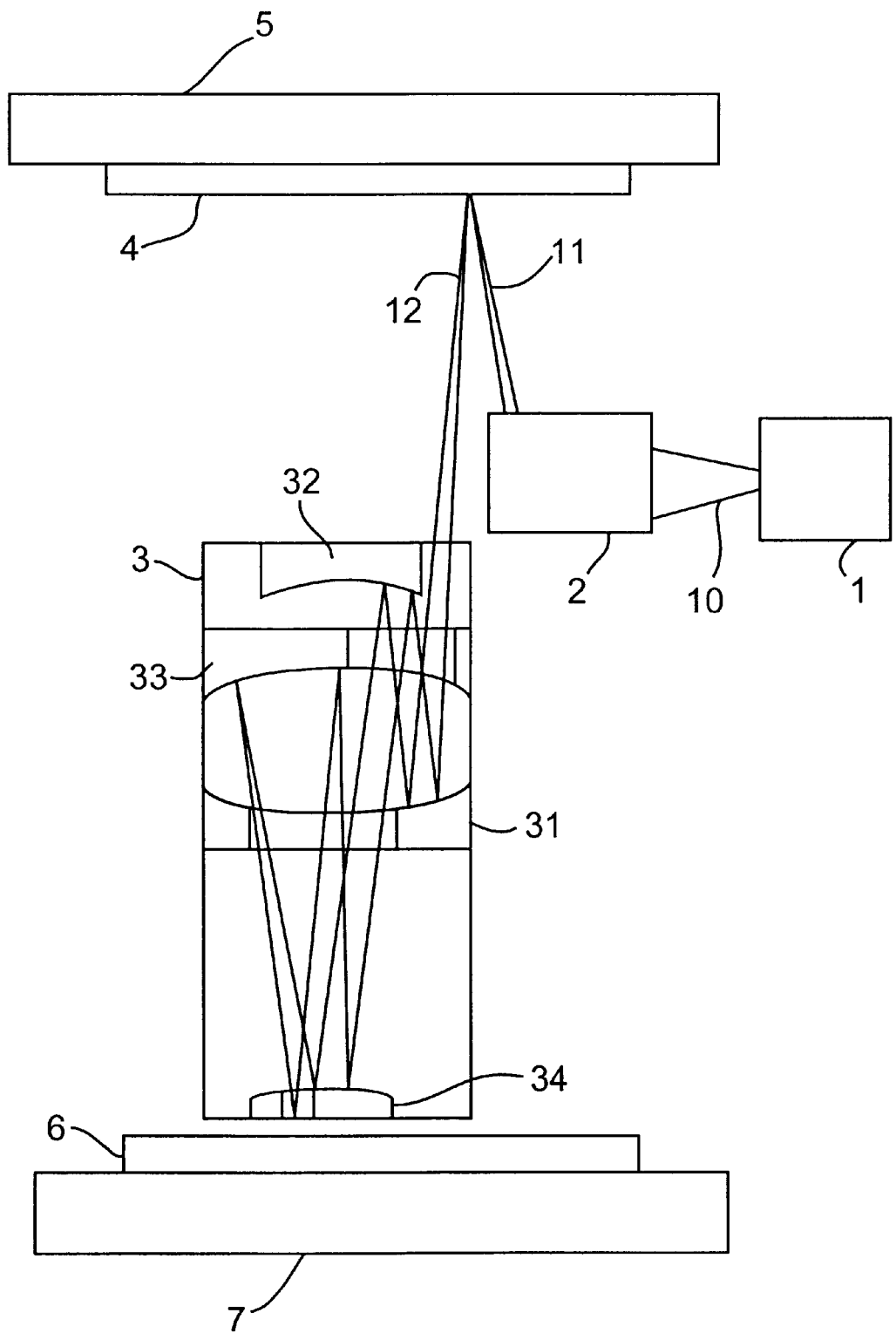
FIG. 5 is a schematic diagram of a proposed design of an X-ray projection exposure apparatus.

The exposing X-ray beam path is similar to that used in the apparatus design shown in FIG. 5. In the present preferred embodiment, in addition to the exposing X-rays, the X-ray source 1 emits light which has a longer wavelength than the exposing X-rays. As an example, visible light is used in the present preferred embodiment. Currently, commonly used laser plasma X-ray sources also emit light in the visible region with a wavelength different from that of the exposing X-rays at a high intensity. In the FIG. 5 design of X-ray exposure apparatus, because such components of light have been considered unnecessary, a filter has been used to cut off the light having wavelengths other than the exposure wavelength. In the present preferred embodiment, this light having wavelengths different from the exposing wavelength is positively used for alignment detection. For example, a laser plasma X-ray source may be used in the present preferred embodiment. Also, light having a longer wavelength than X-rays, such as visible light, etc., is emitted in the case of synchrotron radiation (SOR) light as well. Accordingly, such SOR light can be used as an X-ray source.

As the alignment detection devices 81, 82, an optical device which optically detects the positions of alignment marks on the mask 4 and the wafer 6 may be used. Such an optical device includes at least a detection optical system, which detects light from the alignment marks on the mask 4, and a detection optical system which detects light from the marks on the wafer 6.

The alignment light 90 (detection light) emitted from the X-ray source 1 passes through the X-ray illumination optical system 2, and is directed to alignment marks on the mask 4. The light 91 reflected or scattered from the alignment marks on the mask 4 is detected by the detection optical system 81. The alignment light 92 reflected from the mask 4 passes through the X-ray projection and focusing optical system 3, and is directed towards alignment marks on the wafer 6. The light 93 reflected or scattered by the alignment marks on the wafer is detected by the alignment detector 82. In this way, the positions of the respective alignment marks on the mask and the wafer can be detected.

An illumination optical system is required in order to direct the alignment light emitted from the X-ray source 1 towards the alignment marks on the mask 4. As in the present preferred embodiment, it is preferable to use the X-ray illumination optical system 2 as this alignment illumination optical system. The X-ray illumination optical system 2 is usually constructed of reflective mirrors to process X-rays. Accordingly, the alignment light that has a longer wavelength than the X-rays can also be processed in the X-ray illumination optical system 2 in an adequate manner. Unlike the prior art, such an arrangement eliminates the need to install a separate illumination optical system for illuminating the alignment marks on the mask 4.

The filter 100, which is used to limit the transmitted wavelength, is installed so that light components having a wavelength other than the X-rays contributing to exposure are attenuated or blocked upon exposure. When the X-ray illumination optical system 2 is used as the alignment illumination system as in the present preferred embodiment, the intensity of the alignment light is also attenuated by this filter. Thus, it is desirable to install a mechanism 101 which alters the position of the filter 100, so that the filter 100 can be retracted from the exposing light path during alignment detection. Alternatively, it is also possible to use a filter which attenuates X-rays (or light other than the alignment light) as the filter 100, and to insert this filter 100 during alignment. In another alternative, it is also possible to use a construction in which an alignment filter and an exposure filter are provided, and these filters are alternately positioned in the light path during alignment and exposure, respectively. The movement mechanism used for such an alternating scheme may be operated mechanically, and may be controlled in synchronization with the timing of exposure and alignment. The positions at which these filters are installed may be selected as desired as long as there is no interference with exposure and alignment. Nonetheless, it is desirable to install the filters before the mask 4, because there is no deterioration in the precision of exposure or alignment in such a case.

An illumination optical system is required for directing the alignment light (detection light) to the alignment marks on the wafer. In the present preferred embodiment, the X-ray projection and focusing optical system 3 is used as such an illumination optical system for guiding the alignment light towards the wafer. The alignment light emitted from the X-ray source 1 is directed towards the mask 4, and the light reflected from the mask 4 is directed through the X-ray projection and focusing optical system 3 and directed towards the wafer 6. In most cases, the X-ray projection and focusing optical system 3 is constructed of reflective mirrors to focus and project X-rays. Accordingly, the alignment light, which has a longer wavelength than the X-rays, can also be adequately processed in the X-ray projection and focusing optical system 3. Unlike the prior art, this arrangement eliminates the need to install a separate illumination optical system for illuminating the marks on the wafer 6.

Figure 2:
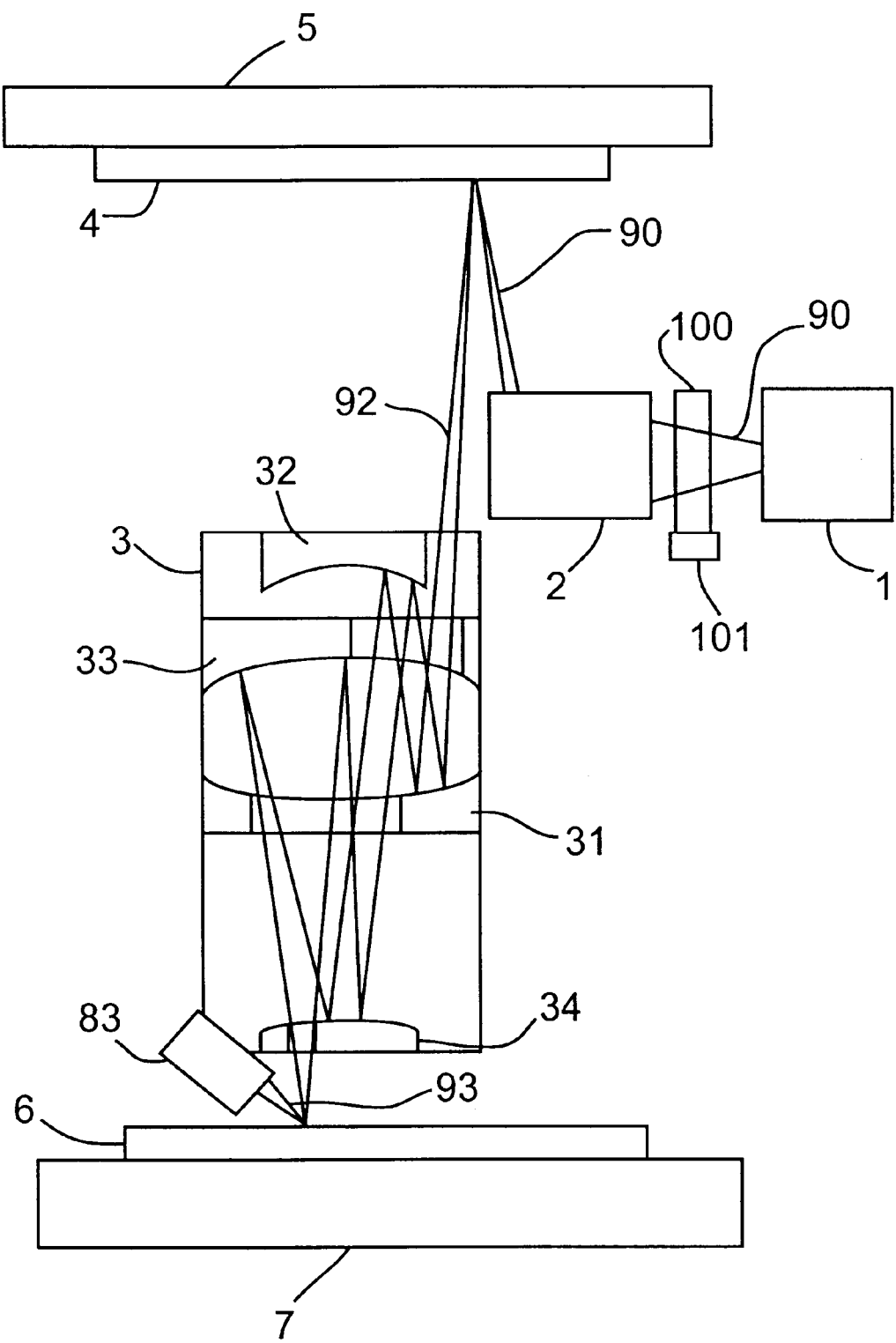
FIG. 2 is a schematic diagram of an X-ray projection exposure apparatus according to another preferred embodiment of the present invention.

As shown in FIG. 2, which illustrates another preferred embodiment of the present invention, the alignment detector 83 may be installed only on the wafer side. In this case, alignment marks on the mask 4 are illuminated by alignment light 90, and the light 92 reflected by the mask 4 is reflected by the reflective mirrors of the X-ray projection and focusing optical system 3, and is guided towards the wafer 6, so that the alignment marks on the wafer 6 are detected by the position detection optical system. In this case, the image of the alignment marks on the mask is projected onto the wafer 6 by the X-ray projection and focusing optical system 3. The image of the alignment marks on the mask 4 is formed at of adjacent the position of the marks on the wafer 6 so that these images can together be detected by the alignment detector 83. In this way, the positional relationship of the mask 4 and the wafer 6 can be determined.

Diffraction grating patterns may be used as the alignment marks. In this case, moire fringes are detected to provide for high-precision detection. Accordingly, such an arrangement is desirable.

Figure 3:
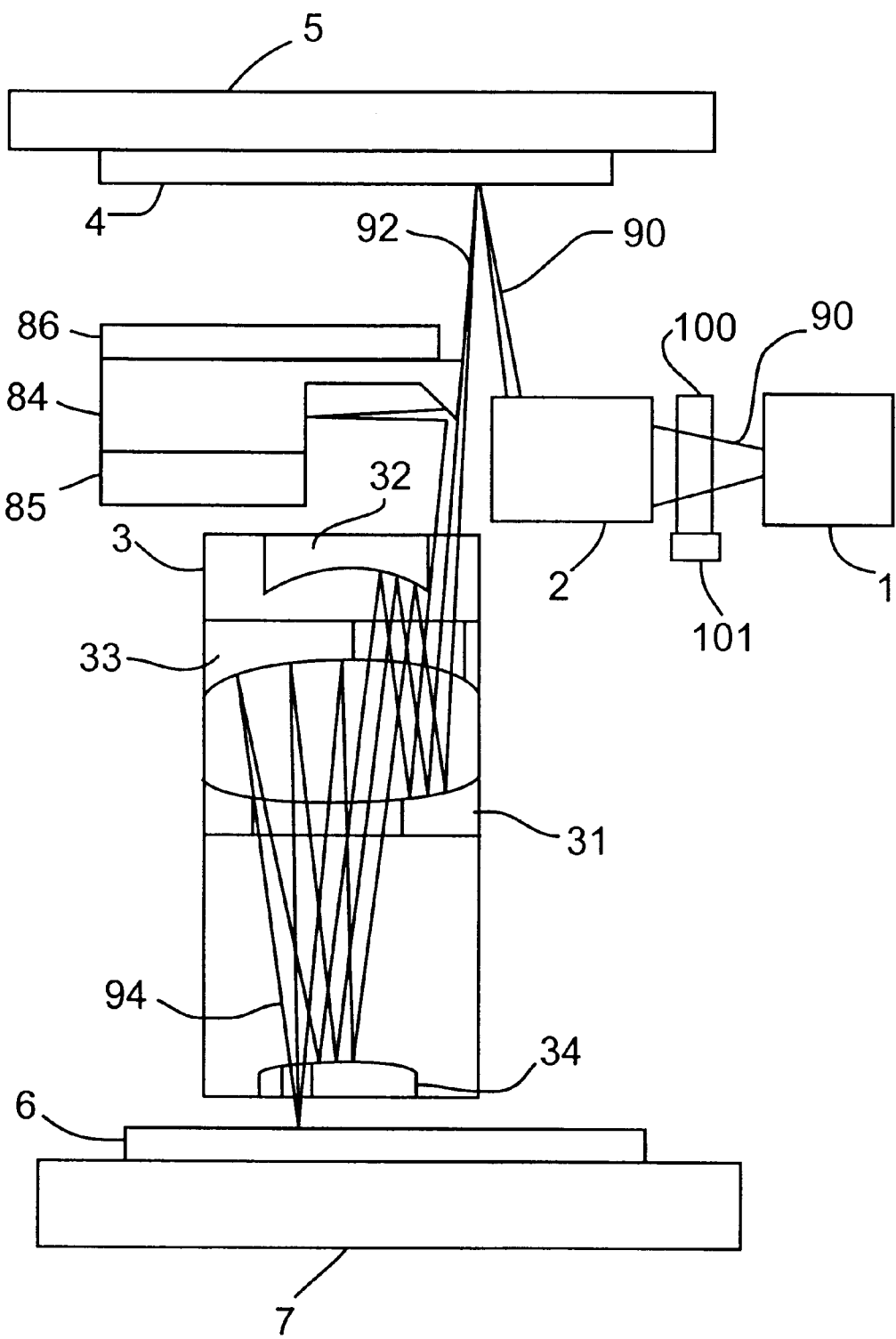
FIG. 3 is a schematic diagram of an X-ray projection exposure apparatus according to still another preferred embodiment of the present invention.
Figure 4:
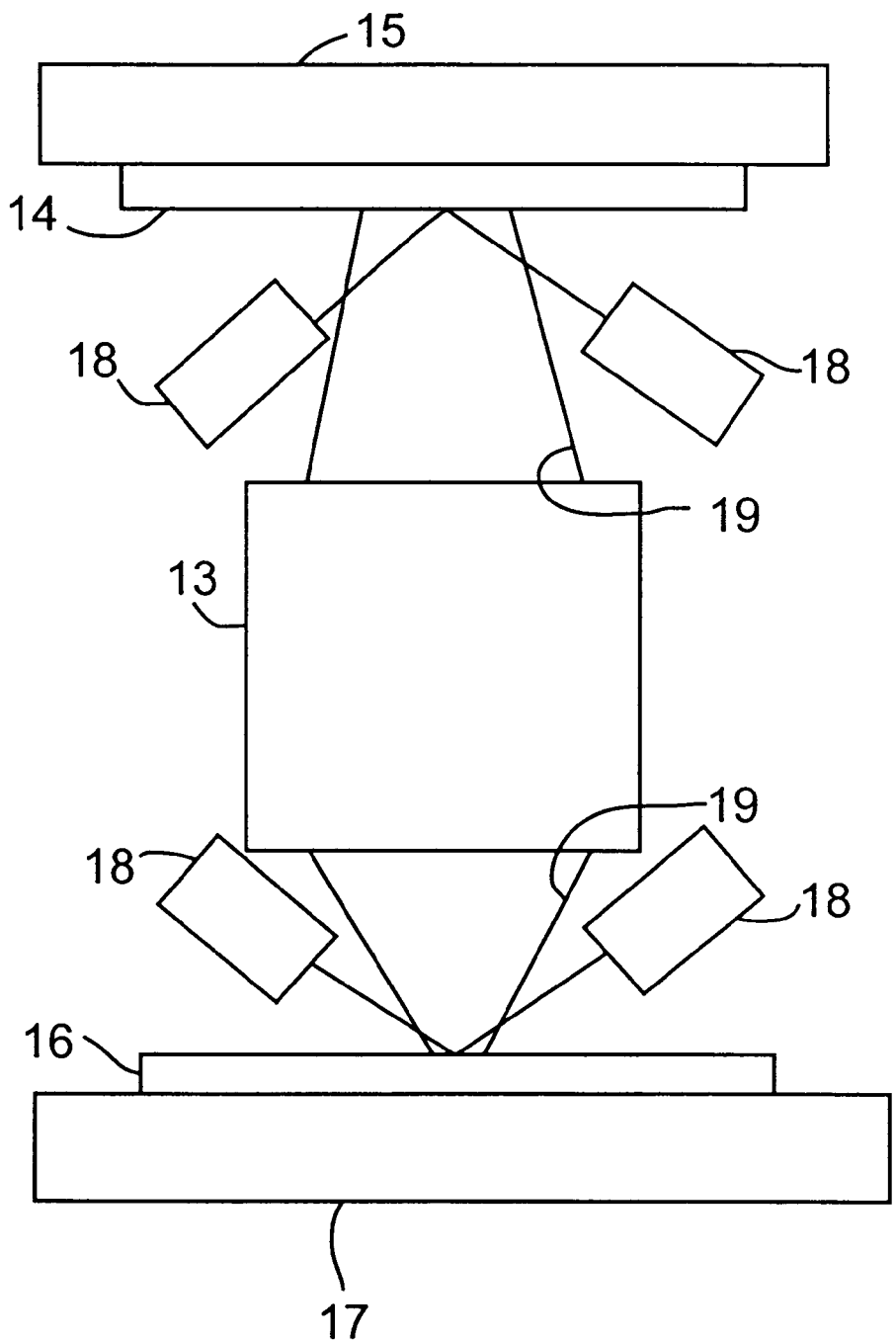
FIG. 4 is a schematic diagram of a conventional i-line projection exposure apparatus.

As shown in FIG. 3, which illustrates still another preferred embodiment of the present invention, an alignment detector may be installed between the mask 4 and X-ray projection and focusing optical system 3. In this construction, the alignment marks on the mask 4 are illuminated by alignment light 90, and the light 92 reflected from the mask 4 is reflected by the reflective mirrors of the X-ray projection and focusing optical system 3, so that this light is guided towards the wafer 6. Furthermore, the light 94 reflected from the wafer 6 is again reflected by the reflective mirrors of the X-ray projection and focusing optical system 3, and is thus introduced into a position detection optical system 84. In the X-ray projection exposure apparatus, the gap between the X-ray projection and focusing optical system 3 and the wafer 6 may be small, and in such cases, it may be difficult to install the detection optical system in the vicinity of the wafer. The arrangement of the type shown in FIG. 3 alleviate such difficulty and makes installation of the alignment detector practical.

In the apparatus shown in FIG. 3, a movement mechanism 85 is installed in the alignment detector. Accordingly, a portion of the position detection optical system can be retracted during exposure to avoid interference with the X-ray light path. Furthermore, by installing a temperature regulating mechanism 86 in the alignment detector, it is possible to suppress any thermal deformation of the detection optical system. Thus, the desired performance of the detection optical system can easily be maintained. Such a movement mechanism and cooling mechanism (temperature regulating mechanism) may also be installed in the apparatuses shown in FIGS. 1 and 2.

Furthermore, in the apparatuses shown in FIGS. 1 through 3, it is desirable that the detection optical system be disposed such that there is no blocking of the alignment light from the mask 4 toward the wafer 6. For example, if the numerical aperture of the position detection optical system is set at about one-half or less of the numerical aperture of the X-ray projection and focusing optical system 3, then the light directed from the mask toward the wafer and the light directed from the wafer toward the detection optical system will have different light paths. Accordingly, such a setting is preferable. In FIG. 3, alignment light beams 90, 92 and 94 are illustrated. As shown in the figure, because the numerical aperture of the alignment optical system is set at half the numerical aperture of the X-ray projection and focusing optical system, there is no interference between the light 92 incident on the wafer and the reflected light 94.

The position detection optical system may also be constructed using half-mirrors. In this case, the light incident on the wafer and the reflected light may share portions of their light paths so that the marks can be detected. If pellicle mirrors are used as half-mirrors, the effect of refraction at the half-mirrors is reduced. Accordingly, such use is desirable.

Furthermore, it is desirable that the alignment marks be positioned adjacent the periphery of the exposure field of view of the X-ray focusing optical system. In particular, in the case of an annular band-form field of view, the alignment marks on the mask can be accurately projected onto the wafer if the marks are disposed at the periphery at both ends in the circular-arc direction of the annular band.

When exposure was performed using the apparatus of the present invention, it becomes possible to project and transfer the mask pattern at a desired position in the wafer. As a result, it becomes possible to obtain a resist pattern with a minimum line-width of about 0.1 µm or even less at a desired position over the entire surface of a region corresponding to one or more of semiconductor chips on the wafer. Therefore, high-precision devices can be manufactured.

In the X-ray projection exposure apparatus of the present invention, as described above, light emitted from an X-ray source may be used as alignment light. Accordingly, the X-ray source may act as both an X-ray light source for exposure and a light source for alignment. Consequently, in the exposure apparatus of the present invention, an alignment device can be installed without installing a separate light source for alignment use. As a result, the mask pattern can be projected and transferred onto the wafer at desired positions, and highly integrated devices can be manufactured.

It will be apparent to those skilled in the art that various modifications and variations can be made in the X-ray projection exposure apparatus of the present invention without departing from the spirit or scope of the invention. Thus, it is intended that the present invention cover the modifications and variations of this invention provided they come within the scope of the appended claims and their equivalents.

What is claimed is:

1. An X-ray projection exposure apparatus, comprising:
   a mask stage configured to hold a mask, the mask having a predetermined pattern thereon;
   a substrate stage configured to hold a substrate;
   an X-ray source that emits light including X-rays;
   an X-ray illumination optical system that directs the X-rays emitted from the X-ray source towards the mask;

an X-ray projection and focusing optical system that receives the X-rays that have interacted with the mask, the X-ray projection and focusing optical system projecting and focusing an image of the predetermined pattern on the mask onto the substrate; and a position detection optical system that optically detects at least one of a mask alignment mark on the mask and a substrate alignment mark on the substrate, wherein the position detection optical system utilizes a detection light for detecting the at least one of the alignment marks, the detection light having a longer wavelength than the wavelength of the X-rays emitted from the X-ray source for exposure.

2. The X-ray projection exposure apparatus according to claim 1, wherein the position detection optical system utilizes at least some portion of the X-ray illumination optical system to direct the detection light towards the at least one of the alignment marks.

3. The X-ray projection exposure apparatus according to claim 1, wherein the position detection optical system utilizes at least some portion of the X-ray projection and focusing optical system to direct the detection light towards the at least one of the alignment marks.

4. The X-ray projection exposure apparatus according to claim 1, wherein the X-ray projection and focusing optical system includes a plurality of reflective mirrors, and wherein the position detection optical system illuminates the mask alignment mark on the mask with the detection light and guides the detection light reflected from the mask to the reflective mirrors of the X-ray projection and focusing optical system to direct the detection light towards the substrate alignment mark, the position detection optical system detecting the detection light that has interacted with the substrate alignment mark to thereby detect the alignment marks on both the mask and the substrate.

5. The X-ray projection exposure apparatus according to claim 1, further comprising:

a filter that restricts the wavelength of the light emitted from the X-ray source; and a filter moving mechanism that controls the position of the filter to selectively restrict the wavelength of the light emitted from the X-ray source to one of the X-ray light and the detection light having a longer wavelength than the wavelength of the X-ray light.

6. The X-ray projection exposure apparatus according to claim 1, wherein the X-ray source comprises a laser plasma X-ray source.

7. The X-ray projection exposure apparatus according to claim 1, wherein the X-ray source comprises an X-ray system for guiding synchrotron radiation.

8. The X-ray projection exposure apparatus according to claim 1, wherein the position detection optical system includes a movable part that is retractable from an optical path of the X-rays.

9. The X-ray projection exposure apparatus according to claim 1, wherein the position detection optical system has a numerical aperture and the X-ray projection and focusing optical system also has a numerical aperture, and wherein the numerical aperture of the position detection optical system is about one-half or less of the numerical aperture of the X-ray projection and focusing optical system.

10. The X-ray projection exposure apparatus according to claim 1, wherein the position detection optical system includes at least one half-mirror.

11. The X-ray projection exposure apparatus according to claim 1, further comprising a temperature regulating mechanism coupled to the position detection optical system to regulate the temperature of the position detection optical system.

12. An X-ray projection exposure apparatus, comprising:

a mask stage configured to hold a mask, the mask having a predetermined pattern thereon;

a substrate stage configured to hold a substrate;

an X-ray source that emits exposing X-rays and detection light having a wavelength different from the exposing X-rays for use in detecting a position of at least one of the mask and the substrate;

an X-ray illumination optical system configured to direct the exposing X-rays and the detection light towards the mask;

an X-ray projection and focusing optical system for receiving the exposing X-rays that have interacted with the mask, and projecting and focusing an image of the predetermined pattern on the mask onto the substrate; and a detector detecting the detection light that has interacted with the mask to derive the position of the at least one of the mask and the substrate.

13. The X-ray projection exposure apparatus according to claim 12, wherein the detection light has the wavelength longer than that of the exposing X-rays.

14. The X-ray projection exposure apparatus according to claim 12, wherein the detector is disposed adjacent the mask stage.

15. The X-ray projection exposure apparatus according to claim 12, wherein the X-ray projection and focusing optical system receives the detection light that has interacted with the mask and directs the detection light towards the substrate, and wherein the detector detects the detection light that has interacted with the substrate to determine the position of at least one of the mask and the substrate.

16. The X-ray projection exposure apparatus according to claim 12, wherein the X-ray projection and focusing optical system receives the detection light that has interacted with the mask and directs the detection light towards the substrate, the X-ray projection and focusing optical system further receiving the detection light that has interacted with the substrate to re-direct the detection light towards the mask, and wherein the detector is disposed between the mask stage and the X-ray projection and focusing optical system to intercept the detection light that has been re-directed towards the mask from the X-ray projection and focusing optical system to determine relative a position between the mask and the substrate.

17. The X-ray projection exposure apparatus according to claim 12, further comprising a filter unit disposed between the X-ray source and the X-ray illumination system along optical paths of the exposing X-rays and the detection light, the filter unit selectively transmitting one of the exposing X-ray and the detection light in accordance with operation modes of the X-ray exposure apparatus which include an exposure mode and an alignment detection mode.

18. The X-ray projection exposure apparatus according to claim 12, wherein the X-ray source comprises a laser plasma X-ray source.

19. The X-ray projection exposure apparatus according to claim 1, wherein the X-ray source comprises an X-ray system for guiding synchrotron radiation.

* * * * *